United States Patent [19]
Yamada et al.

[11] Patent Number: 5,319,479
[45] Date of Patent: Jun. 7, 1994

[54] DEPOSITED MULTI-LAYER DEVICE WITH A PLASTIC SUBSTRATE HAVING AN INORGANIC THIN FILM LAYER

[75] Inventors: Katsuyuki Yamada, Mishima; Eiichi Ohta, Kawasaki; Kenji Kameyama, Sagamihara; Hitoshi Kondo, Machida; Yuji Kimura, Yokohama; Masaetsu Takahashi, Yokohama; Makoto Tanabe, Yokohama, all of Japan

[73] Assignee: Ricoh Company, Ltd., Tokyo, Japan

[21] Appl. No.: 753,079

[22] Filed: Aug. 30, 1991

[30] Foreign Application Priority Data

| Sep. 4, 1990 | [JP] | Japan | 2-234177 |
| Nov. 29, 1990 | [JP] | Japan | 2-325323 |
| Feb. 6, 1991 | [JP] | Japan | 3-036843 |
| Jul. 3, 1991 | [JP] | Japan | 3-189336 |

[51] Int. Cl.⁵ ............... G02F 1/1343; G02F 1/1333; G02F 1/1335; B05D 3/06
[52] U.S. Cl. ..................... 359/58; 427/578; 427/589; 359/62; 359/79; 359/82
[58] Field of Search ............ 359/58, 62, 74, 79, 359/82; 427/40, 578, 583, 589

[56] References Cited

U.S. PATENT DOCUMENTS

| 4,709,991 | 12/1987 | Hoshikawa | 359/74 |
| 4,737,379 | 4/1988 | Hudgens et al. | 136/256 X |
| 5,008,732 | 4/1991 | Kondo et al. | 357/71 |
| 5,041,303 | 8/1991 | Wertheimer et al. | 427/40 |
| 5,101,288 | 3/1992 | Ohta et al. | 359/54 |
| 5,117,299 | 5/1992 | Kondo et al. | 359/58 |
| 5,128,784 | 7/1992 | Suzuki et al. | 359/58 |
| 5,132,676 | 7/1992 | Kimura et al. | 340/784 |
| 5,142,390 | 8/1992 | Ohta et al. | 359/58 |
| 5,153,753 | 10/1992 | Ohta et al. | 359/58 |

FOREIGN PATENT DOCUMENTS

| 62-291081 | 12/1987 | Japan . |
| 64-040929 | 2/1989 | Japan . |
| 3-130363 | 6/1991 | Japan . |

*Primary Examiner*—William L. Sikes
*Assistant Examiner*—Ron Trice
*Attorney, Agent, or Firm*—Oblon, Spivak, McClelland, Maier & Neustadt

[57] ABSTRACT

A deposited multi-layer device of an electronic element and a plastic substrate on which an inorganic substance thin film layer is simultaneously formed on both surfaces of the substrate wherein each of the electronic element, plastic substrate and inorganic thin film have internal and thermal stress not equal to zero. The device is free from peeling, deformation or curl of the substrate and degradation due to impurities such as acid, alkali and water.

11 Claims, 4 Drawing Sheets

3040cm⁻¹ SP² CH(arom)
3000cm⁻¹ SP² CH(olef)
2960cm⁻¹ SP³ CH₃ (dsym)
2920cm⁻¹ SP³ CH
2850cm⁻¹ SP³ CH₂ (sym)

DEPOSITED MULTI-LAYER DEVICE WITH A PLASTIC SUBSTRATE HAVING AN INORGANIC THIN FILM LAYER

BACKGROUND OF THE INVENTION

The present invention concerns a deposited multi-layer device having a plastic substrate with an inorganic thin film layer on the surface and being suitable, for instance, to a flat panel display used for office automation equipment, a television apparatus and the like.

In a terminal unit for office automation equipment and a liquid crystal television apparatus, the use of a large area liquid crystal panel has been strongly requested and an active matrix system in which a switch is placed on each picture element to maintain a necessary voltage is disclosed in Japanese Patent Application Laid-Open (KOKAI), Nos. 260,219 (1986) and 62,333 (1987).

On the other hand, extensive studies were made recently for reducing the weight and cost of liquid crystal panels and Japanese Patent Application Laid-Open (KOKAI), No. 47,769 (1989), for instance, discloses a switching device with a plastic substrate.

However, when a deposited multi-layer switching device, for instance, is formed on a plastic substrate, peeling of the deposited multi-layer is caused by a deformation or a curl of the substrate. Further, since a process for fabricating the device includes a photolithographic step, in which a dipping of the device together with the substrate in an aqueous solution of acid or alkali or water is necessary, an acid, an alkaline or water remains in the substrate and can be a cause of spoiling the device later. Further, when a fine pattern is to be formed in the device, shift of a part of the pattern is caused due to an elongation and a shrinkage of the substrate and results in a problem, for instance, that a simultaneous exposure of a large area pattern is difficult or an anisotropy in an elongation and shrinkage of the substrate makes the patterning difficult.

On the other hand, in the fabrication of a liquid crystal display device with a plastic substrate, alignment of liquid crystal molecules requires a specific and complicated treatment on the substrate. In order to avoid this, Japanese Patent Publication, No. 47,769 (1989) discloses that when an $SiO_2$ layer is formed on one surface of the substrate, the aligning can be applied in the same manner as on a glass substrate. However, when an $SiO_2$ thin film is coated on a plastic substrate and a deposited multi-layer device is fabricated thereon, crack formations on the $SiO_2$ thin film are often observed and give an insufficient reliability to the device.

In order to improve crack resistance and humidity resistance of the $SiO_2$ film, a technique of applying a plasma treatment with a fluorine containing gas to a surface of the film has been disclosed in Japanese Patent Application Laid-Open (KOKAI), No. 25,543 (1989). However, since this method is merely a surface treatment of the film with fluorine and not the fluorination of the entire film and further since the fabrication of the $SiO_2$ film is based on a wet process by a spin-on-glass (hereinafter referred to as "SOG") method, shrinkage of the film is inevitable and still is a cause of cracks.

The present inventors have made an earnest study with an aim of fabricating a reliable and inexpensive deposited multi-layer device with a plastic substrate and, as a result, have realized that curl is the largest problem of the deformation of a plastic substrate upon fabrication of the device, and that causes of the deformation are an internal stress in deposited thin films, a relation between the above stress and the stress of the inorganic substance thin film layer, thermal expansion and shrinkage of the plastic substrate and further, more or less, a swelling of the plastic material of the substrate. It has been found that forming an inorganic substance thin film on the substrate is an effective countermeasure to prevent these causes of deformation. Based on these findings, they have attained the present invention. Further, when the thickness of the inorganic substance thin film is increased in order to reduce the generation of pinholes and to increase the rigidity of the film, cracks on the film are often observed and it has been confirmed that the use of fluorine-containing silicon compound as the thin film is effective for preventing the cracking.

Figure 1:
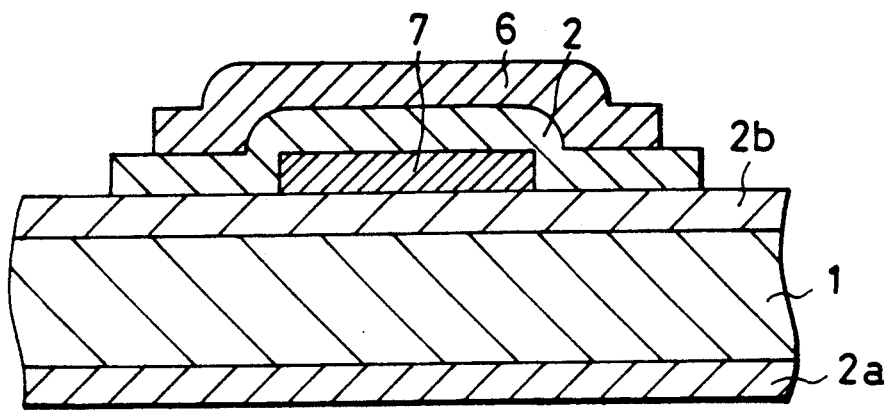
FIG. 1 is a cross sectional view illustrating a structure of a deposited multi-layer device with a plastic substrate according to the present invention.

Reference numerals used in these drawings have the following meanings.
1: Plastic substrate.
1': Plastic substrate for a liquid crystal display device.
2: Insulating film.
2a, 2b: Inorganic substance thin film layer.
3: Liquid crystal.
4: Picture element electrode.
4': Common electrode.
5: Active element (MIM device case).
6: Upper electrode (lead electrode).
7: Lower electrode.
8: Aligning film.
9: Gap material.
10: Sputter target.
11: Substrate holder.
12: Vacuum chamber.

SUMMARY OF THE INVENTION

An object of the present invention is to provide a deposited multi-layer device formed on a plastic substrate, in which a first inorganic substance thin film layer is placed on one surface and a second inorganic substance thin film layer on the other surface of the substrate.

Another object of the present invention is to provide a deposited multi-layer device with a plastic substrate, in which the first and the second inorganic substance thin film layers are formed on each surface of the substrate simultaneously.

A further object of the present invention is to provide a deposited multi-layer device with a plastic substrate, in which at least one of the first and the second inorganic substances thin film layers comprises a fluorine-containing silicon compound.

A still further object of the present invention is to provide a deposited multi-layer device with a plastic substrate, in which a total value of stress in the inorganic substance thin film layer on which the deposited multi-layer device is fabricated and a stress in the device is substantially equal to a value of stress in the order inorganic substance thin film layer.

A further object of the present invention is to provide a deposited multi-layer device with a plastic substrate, using a hard carbon film as an insulating layer.

A still further object of the present invention is to provide a liquid crystal display device incorporated with a deposited multi-layer device with a plastic substrate according to the present invention.

A final object of the present invention is to provide a deposited multi-layer device fabricated on a plastic substrate, which substrate is coated with an inorganic substance thin film layer on one surface but the fabrication is carried out with severer conditions.

DETAILED DESCRIPTION OF THE INVENTION

The present invention concerns a deposited multi-layer device with a plastic substrate, in which a first and second inorganic substance thin film layers are coated on both surfaces of the plastic substrate and a deposited multi-layer device is fabricated on one of the thin film layers.

As an inorganic substance for forming the thin film layer, inorganic materials such as $SiO_2$, $SiO$, $Si:O:N$, $Si:O:H$, $Si:N:H$, $Si:O:N:H:$, $Si_3N_4$, $TiO_2$, $ZnS$, $ZnO$, $Al_2O_3$, $AlN$, $MgO$, $GeO$, $ZrO$, $Nb_2O_5$, $SiC$ and $Al_2O_5$ and fluorine-containing silicon compounds such as $Si:O:F$, $SiO_2:F$, $SiO_x:F$ ($x<2$), $Si_3N_4:F$, $SiN_x:F$ ($x \leq 1.3$), $SiON:F$, $SiO_x:CF_y$ ($x \leq 2$, $y<4$) can be exemplified. If required, hydrogen atoms may be bonded with silicon atoms to reduce dangling bonds.

Formation of a thin film made of an inorganic substance or a fluorine-containing silicon compound on surfaces of the plastic substrate is important for preventing peeling of the deposited multi-layer device to be fabricated thereon. If the thin film is formed only on one surface of the substrate, the substrate often curls in accordance with an internal stress of the thin film thereby bringing about a problem in view of handling. In order to avoid this, it is particularly preferable to form the thin film on both surfaces of the substrate. However, even in the case of forming the thin film only on one surface of the substrate, it is not always impossible to prevent the peeling of the device, by strictly selecting and controlling the material and thickness of the inorganic substance thin film layer, as well as those of the plastic substrate. However, since the allowable ranges for selection of the materials and control of the thickness are narrow, it is advisable to consider carefully whether one side coating or two side coating should be applied.

The plastic substrate referred to in the present invention means a substrate made of a plastic film or a sheet and, as the plastic, polyethylene terephthalate, polyarylate, polyether sulfone, polycarbonate, polyethylene, polymethyl methacrylate and polyimide can be exemplified.

For fabricating the deposited multi-layer device according to the present invention, it is preferable to form, on both surfaces of a plastic substrate, thin film of an inorganic substance, a such as $SiO_2$, $SiO$, $SiON$, $SiO:H$, $SiN:H$, $SiON:H$, $Si_3N_4$, $TiO_2$, $ZnS$, $ZnO$, $Al_2O_3$, $AlN$, $MgO$, $GeO$, $ZrO_2$, $Nb_2O_5$, $SiC$ and $Ta_2O_5$, or of a fluorine-containing silicon compound such as $SiO:F$, $SiO_2:F$, $SiO_x:F$, $Si_3N_4:F$, $SiN_x:F$, $SiON:F$, $SiC:F$ and $SiO_x:CF_y$, by means of, for example, sputtering, vapor deposition, plasma CVD or a like, having a necessary stress in thickness of 300 to 15,000 Å, more preferably, of 1,000 to 10,000 Å. It is not always necessary to use the same inorganic substance on both surfaces of the substrate and further to make thickness of the both surface films equal.

Particularly preferable inorganic substances are $SiO_2$, $Si_3N_4$, $SiON$, $SiO:H$, $SiN:H$, $SiON:H$, $AlN$, $SiO_2:F$, $SiON:F$ and $Si_3N_4:F$.

In the case of forming a film of a fluorine-containing silicon compound on the plastic substrate, since the surface of the compound has a low energy, its adhesion to plastic or the deposited multi-layer device is small and, accordingly, it is preferable that the silicon compound film contains no fluorine or a small amount of fluorine at the surface contacting the plastic substrate or the deposited multi-layer device. Although an allowable limit of fluorine content at a surface of the inorganic substance thin film layer depends on which fluorine compound is incorporated in the silicon compound, in general, it is preferable to limit the fluorine content at the surface to less than 25% by atomic ratio. For this purpose, it is possible to control the fluorine content in the film to be distributed along the thickness of the film by incorporating a fluorine compound such as $F_2$, $HF$, $CF_4$, $SiF_4$, $(CH_3)_3SiF$, $(C_6H_5)_3SiF$, $(C_6H_5)_2SiF_2$ in the fluorine containing silicon compound.

The atomic ratio of fluorine to silicon (F/Si) in a portion of the film other than the surface is preferably within the range of 0 to 1.5 in view of easy formation of a network with molecules of the silicon compound and rigidity of the film, etc. When the ratio is larger than 1.5, it is not preferable since the probability of damage to the network and reduced a rigidity of the film increases.

When the inorganic substance thin film is crystalline, water, acid or alkali, if present in the substrate, can permeate through gaps between crystal grains, reach the deposited multi-layer device and damage the device. Further, many crystal lumps can grow around crystal nuclei, which have been formed already, in the heating step during the fabrication of the deposited multi-layer device, and cause cracks in the thin film. Still further, the crystallinity can generate an anisotropy in the elongation and shrinkage of the substrate due to an anisotropy of thermal expansion of the crystallized thin film and possibly make formation of a fine pattern difficult. In order to avoid such problems, it is preferable to form an amorphous thin film of an inorganic substance on the plastic substrate. Since the fluorine-containing silicon compound has low crystallinity, the thin film can be maintained easily in an amorphous state and, accordingly, formation of the fluorine-containing silicon compound film at least on one side of the substrate is effective for avoiding the disadvantages caused by the crystallization. In this case, the thin film is preferably fabricated at a substrate temperature of lower than 200° C. by means of sputtering or plasma CVD (chemical vapor deposition) and a temperature lower than 150° C. is preferable. A temperature higher than 200° C. is not preferable since crystallization of the film is promoted or it causes a problem in heat resistivity of the substrate.

When incorporating the deposited multi-layer device with a substrate according to the present invention into a liquid crystal display device, it is preferable to take the light transmittance of the inorganic substance thin film layer used into consideration to ensure adequate contrast of the display device and to select a thin film having 75% or higher transmittance for light of a wavelength from 400 to 850 nm.

Description will be made in detail for a method of preventing curl of the substrate which is the largest problem when plastic is used.

Upon forming the thin films on both surfaces of the plastic substrate, if the thin films are formed one by one, the substrate is prone to curl just after the first formation of a film unless the first film is formed with utmost care. Further, film forming labor is doubled in this case bringing about a problem in the productivity and the cost. Accordingly, it is preferable to use a method of forming the films on both surfaces of the substrate simultaneously.

Further, the thickness of the plastic substrate is preferably 50 $\mu$m to 2 mm, more preferably 50 to 500 $\mu$m and further preferably 50 to 300 $\mu$m.

If the thickness is less than 50 $\mu$m, generation of curl may increase. On the other hand, if it is larger than 2 mm, not only the effect obtained by the increase of the thickness is saturated, but also the total thickness of the device is increased and light transmittance of the substrate is reduced.

Description will now be made for prevention of curl when fabricating a deposited multi-layer device on a plastic substrate coated on both surfaces with inorganic substance thin films, in other words, for taking a balance of stresses.

Generally, the extent of curl of a substrate depends on an internal stress in the thin film formed thereon and the extent is also affected by a thermal stress due to the temperature upon forming the thin film when a plastic substrate having a large linear expansion coefficient is used.

Accordingly, in order to fabricate a deposited multi-layer device on a plastic substrate and establish a flat structure, it is especially preferable to provide a substrate having a stress which can cancel the internal stress and thermal stress caused upon the fabrication. That is, when fabricating a deposited multi-layer device on a plastic substrate having inorganic substance thin film layers on the both surfaces, it is preferable to form an inorganic substance thin film having stresses according to the following equation. However, the following equation represents the case when the multi-layer device is fabricated on a second inorganic substance thin film layer.

Stress of deposited multi-layer device + Stress of second inorganic substance thin film layer = Stress of first inorganic substance thin film layer.

Since the stress of the inorganic substance thin film is determined depending on the material and thickness of the film, when the first and the second thin films are formed on each surface of the substrate using the same material, the stresses of the respective films can be controlled only by the film thickness and accordingly this method is preferable.

As the deposited multi-layer device, a MIM device comprising layers of metal-insulator-metal, a MSI device comprising metal-semiinsulator layers as disclosed in Japanese Patent Application Laid-Open (KOKAI), No. 275,811 (1986), a SIS device comprising semiconductor-insulator-semiconductor layers, a MIMIM device comprising metal-insulator-metal-insulator-metal layers as disclosed in Japanese Patent Application Laid-Open (KOKAI), No. 7,577 (1989) can be exemplified. Further, a hard carbon film is preferably used as an insulator in the above devices, and a combination of the carbon film and the MIM device is particularly preferable.

However, since the ratio of generating curl of the substrate increases when a hard carbon film is used, it is preferable to practice the thin film forming on the substrate taking thickness and modulus of elasticity of the thin film into careful consideration. In the following description of a fabrication process of the above devices, to make a complex story simple and clear, an MIM device will be taken as an example referring to FIGS. 1 to 3, but it is apparent that other devices can also be fabricated based on the identical concept.

First, a thin film is formed using a transparent electroconductive material for picture element electrodes by means of vapor deposition or sputtering on a plastic substrate coated on both surfaces with inorganic substance thin films 2a and 2b, and the electrodes are patterned by a conventional method into a necessary pattern and obtain picture element electrodes 4.

Then, in a similar method as above, a first conductor film, which is a precursor of a lower electrode, is formed on the picture element electrodes, is patterned by wet or dry etching and obtain a lower electrode 7. An upper surface of the electrode 7 is covered with a hard carbon film by means of, for example, plasma CVD (Chemical Vapor Deposition) or ion beam method, the carbon film is patterned by dry etching, wet etching or lifting off method using resist to obtain an insulating film 2. An upper surface of the film 2 is further covered with a second conductor thin film for lead electrodes by vapor deposition, sputtering or the like and then patterned into a upper electrode 6. Finally, the unnecessary portion of the lower electrode 7 is removed to expose the transparent electrode 4 having a required pattern.

However, the constitution of the deposited multi-layer device with a substrate according to the present invention is not restricted only to the foregoing embodiment but various modifications are possible, for instance, the transparent picture element electrode 4 is finally placed as the uppermost layer and the electrode 4 serves simultaneously as the upper electrode 6 or the lower electrode 7.

Thicknesses of the transparent picture electrode 4, the upper electrode 6 and the lower electrode 7 are preferably within a range of several hundred to several thousand Å. The thickness for the hard carbon insulting film 2 is preferably within a range of 100 to 8,000 Å, more preferably, within a range of 200 to 6,000 Å and, further preferably, within a range of 300 to 4,000 Å.

Further, when a plastic substrate is used, since a heating treatment of the substrate to a high temperature is frequently necessary for fabrication of an active matrix device using active elements, there exists a difficulty in heat resistivity of the substrate. However, because a hard carbon insulating film of good quality can be formed on the substrate even at room temperature, fabrication of the active matrix device on the plastic substrate can be done without trouble, and the image quality is also improved greatly.

Material used for an MIM device according to the present invention will be described in detail.

As a material for the first conductor, which is a precursor of the lower electrode 7, Al, Ta, Cr, W, Mo, Pt, Ni, Ti, Cu, Au, indium-tin oxide (hereinafter referred to as "ITO"), Zn:Al, $In_2O_3$ and $SnO_2$ can be exemplified.

As a material for the second conductor, which is a precursor of the upper electrode (lead electrode) 6, Al, Cr, Ni, Mo, Pt, Ag, Ti, Cu, Au, W, Te, ITO, ZnO:Al and $In_2O_3$ can be exemplified. Among them, Ni, Pt and Ag which have excellent stability and reliability in I-V relationship are especially preferable. For a combination of the upper and lower electrodes, 6 and 7, although it is preferable to select materials having a small difference in work function between them, for MIM devices having a hard carbon film 2 as an insulating film, since the symmetric property thereof does not change even when the kind of electrode material is altered and since Poole-Frenkel conduction is present judging from a relation: $\ln I \propto \sqrt{V}$, any combination of the materials for the upper and lower electrodes can be applied.

On the other hand, since the device characteristics (I-V characteristics) may be damaged or varied depending on adhesion between the hard carbon film and the electrodes or the state of the boundary therebetween, Ni, Pt and Ag are also preferable as materials for the electrodes in view of the above.

Figure 4A:
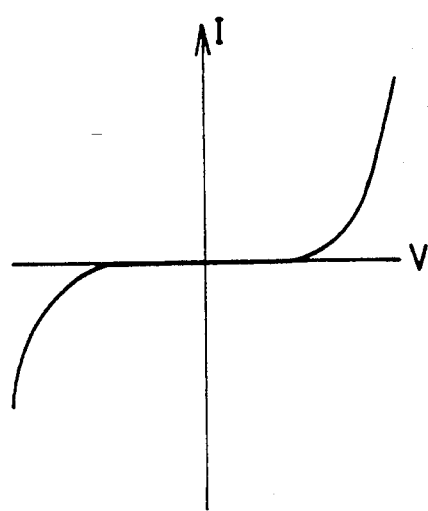
FIG. 4a is a I-V characteristic curve of a MIM device.
Figure 4B:
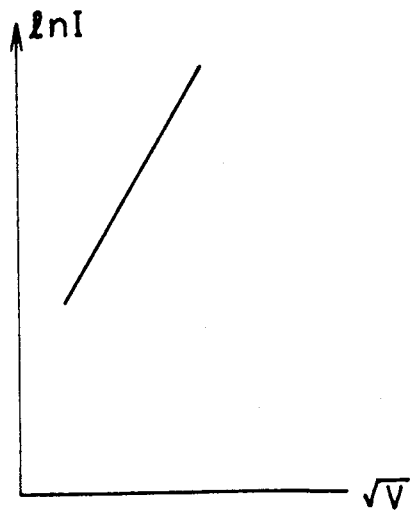
FIG. 4b is a graph illustrating a ln I-$\sqrt{V}$ characteristic curve (in the present specification, I represents "current" and V "voltage").

The I-V characteristics of the MIM device according to the present invention are shown in FIG. 4. The characteristics are also represented approximately by the following equations (1), (2) and (3):

$$I = K_{exp}(\beta V^{\frac{1}{2}}) \quad (1)$$

$$K = n\mu q/d \, exp\left(\frac{-\phi}{kT}\right) \propto \frac{1}{pd} \quad (T = const) \quad (2)$$

$$\beta = \frac{1}{kT}\left(\frac{q^3}{\pi\epsilon_1\epsilon_2 d}\right)^{\frac{1}{2}} \propto \frac{1}{\sqrt{\epsilon_1 d}} \quad (T = const) \quad (3)$$

wherein:
K: conduction coefficient
$\beta$: Poole-Frenkel coefficient
n: carrier density
$\mu$: carrier mobility
q: electron charge amount
$\Phi$: trap depth
$\rho$: specific resistivity
d: thickness of hard carbon film (Å)
k: Boltzman's constant
T: atmospheric temperature
$\epsilon_1$: dielectric constant of heard carbon
$\epsilon_2$: dielectric constant in vacuum A method of fabricating a liquid crystal display device incorporated with a deposited multi-layer device with a substrate according to the present invention will be described referring to FIG. 3.

As a first step, a transparent conductor for a common electrode, for example, ITO, ZnO:Al, ZnO:Si, $SnO_2$ or $In_2O_3$ is formed into a film of a thickness from several hundred Å to several $\mu$m on an insulating substrate 1' by means of sputtering, vapor deposition or the like, and patterned in a stripe to form a common electrode 4'.

An aligning film 8, for example made of polyimide, is formed on each surface of the substrates 1' and 1, on which the MIM devices as described previously are placed in a matrix form (refer to FIG. 1), and applies a rubbing treatment. Then, a constant gap is formed between the substrates by using sealing materials and gap materials 9 and liquid crystals 3 are sealed therein to form a display device.

Description will now be made of the hard carbon film used in the MIM device. For forming the carbon film, a gas of an organic compound, in particular, a gas of a hydrocarbon is used. The organic compound does not necessarily have to be in the gas phase under normal temperature and normal pressure but any organic compound which can be gasified by heating or pressure reduction can also be used even when it is in a liquid or solid phase under normal conditions.

As the gas, those containing the element carbon, for example, alcohols, ketones, ethers, esters, CO and $CO_2$ can be used in addition to hydrocarbons. Among them, it is preferable to use a gas containing at least one hydrocarbons, for instance, paraffinic hydrocarbons such as, $CH_4$, $CH_2H_6$, $C_3H_8$ and $C_4H_{10}$, acetylenic hydrocarbons such as, $C_2H_2$, olefinic hydrocarbons such as, $C_3H_6$ and $C_4H_8$, diolefinic hydrocarbons and aromatic hydrocarbons.

As a method for forming the hard carbon film from the gas described above, it is preferable to use a method which forms film-forming active species by way of a plasma state formed by a plasma process using an electric current such as DC current, low frequency wave, high frequency wave or microwave. However, a method of utilizing a magnetic field effect of depositing at a low pressure aiming for a large area film forming, an improved homogeneous film-forming and a low temperature film-forming is more preferable. As the method for forming the active species, there is a method of forming with a high temperature thermal decomposition, a method of forming by way of an ionized state by ionizing vapor deposition or ion beam vapor deposition, a method of forming via neutral particles generated by vapor deposition or sputtering, as well as a combination of the above.

The conditions for forming the carbon film are shown below taking a plasma CVD process as an example.
RF output: 0.1 to 50 W/cm$^2$
Pressure: $10^{-3}$ to 10 Torr
Deposition: Room temperature to
temperature: 350° C.; preferably room temperature to 250° C.

In this plasma state, the starting gas is decomposed into radicals and ions which react each other at a surface of the substrate and a hard carbon film is formed containing at least one of an amorphous phase or an extremely fine crystalline (size of crystals: several tens Å to several $\mu$m) phase both of which are essentially consisting of carbon and hydrogen atoms. The properties of the carbon film are shown in Table 1.

TABLE 1

| Item | Value |
| --- | --- |
| Specific Resistivity (ρ) | $10^6$–$10^{13}$ ohm · cm |
| Optical Band Gap (Egopt) | 1.0–3.0 eV |
| Hydrogen Amount in the Film [C(H)] | 10–50 atom % |
| SP$^3$/SP$^2$ Ratio | 2/1–4/1 |
| Vickers Hardness (H) | Not higher than 9,500 kg/mm$^2$ |
| Refractive Index (n) | 1.9–2.4 |
| Defect Density | $10^{17}$–$10^{19}$/cm$^3$ |

Measuring methods for the properties shown in Table 1 are shown below.

Specific resistivity (ρ): Determined based on I-V relationship obtained by coplaner type cell.

Optical band gap (Egopt): Absorption coefficient α is determined based on spectral characteristic, Poole-Frenkel coefficient β is determined from the equation (3) described before and Egopt is calculated by the following equation:

$$(ahu)^{\frac{1}{2}} = \beta(hu - Egopt)$$

wherein h represents a plank constant and u represents a frequency.

Hydrogen amount of film [C(H)]: Determined by integrating peaks in IR absorption spectra near 2,900 cm$^{-1}$ and multiplied with an absorption cross section A, namely, according to the following equation:

$$[C(H)] = A \int \alpha(v)/v\, dv$$

wherein α represents an absorption coefficient and v represents a number of waves.

SP$^3$/SP$^2$ ratio: Decomposing IR absorption spectrum into a Gaussian functions belonging to SP$^3$ and SP$^2$ and determined the ratio based on the area ratio of the functions.

Vickers hardness (H): By the microvickers meter.

Refractive index: With Elipsometer.

Defect density: According to Electron Spin Resonance.

Figure 5:
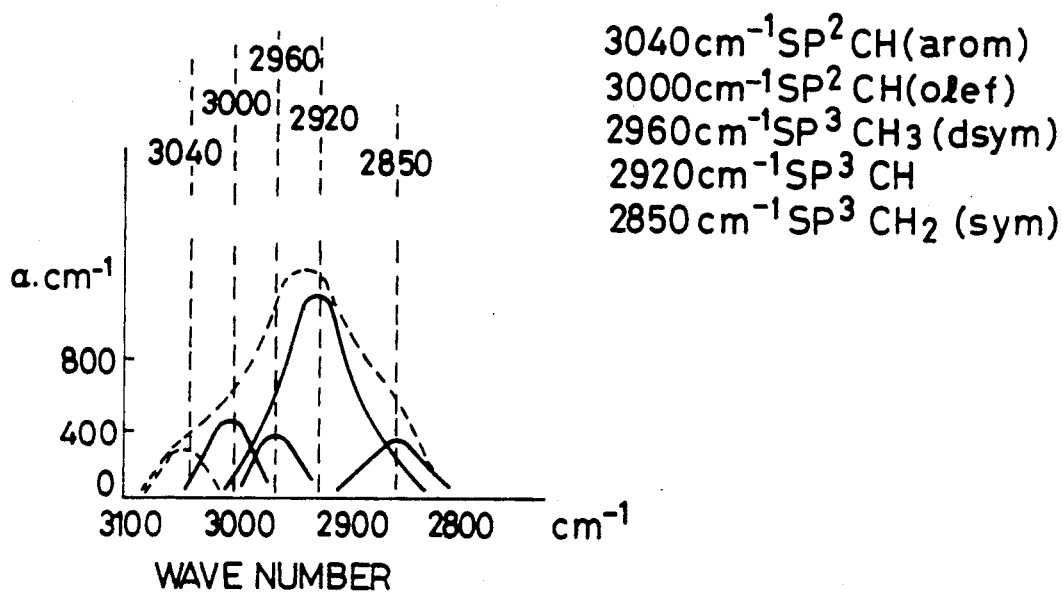
FIG. 5 shows a Gauss distribution of IR absorption spectra of a hard carbon film used for an insulation of the MIM device according to the present invention.
Figure 6:
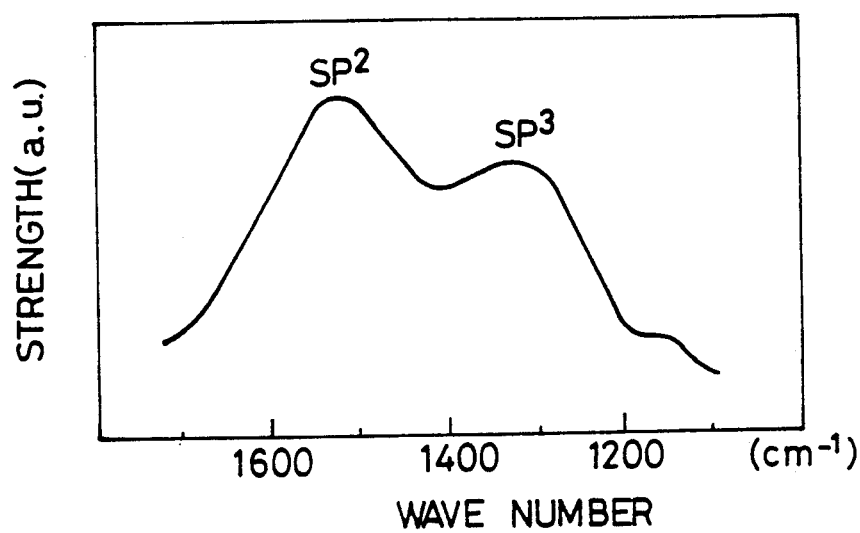
FIG. 6 shows a Raman spectra of a hard carbon film used for an insulation of the MIM device according to the present invention, as well as a result of analysis.
Figure 7:
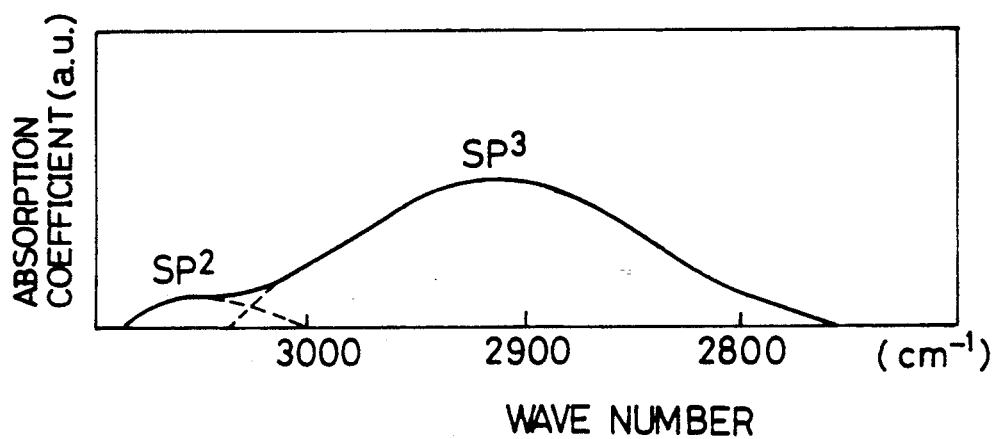
FIG. 7 shows IR absorption spectra of the carbon film, and a result of analysis.

When the formed carbon film is analyzed by Raman spectrometry and IR absorption methods, as are shown on FIGS. 5 to 7, it is apparent that inter-atom bonds formed with SP$^3$ hybrid orbital and carbon atoms and inter-atom bonds formed with SP$^2$ hybrid orbital and carbon atoms are present together. The ratio of SP$^3$ bond and SP$^2$ bond can nearly be estimated by separating peaks of IR spectra. That is, in the IR spectra of the film, spectra of various modes from 2,800 to 3,150 cm$^{-1}$ are superposed and measured as shown by the dotted line in FIG. 5, and belonging of peaks to the respective number of waves are apparent and the SP$^3$/SP$^2$ ratio can be determined by separating peaks by the Gaussian distribution as shown in FIG. 5, calculating respective peak areas and determining the ratio thereof. Further, based on X-ray and electron ray diffractometry, it has been found that the carbon film is in an complete amorphous state or in an amorphous state containing fine crystallites in a size of about 50 Å to several μm.

When a plasma CVD process, which is used frequently because the process is generally suitable for mass production, is applied to formation of the carbon film, since a specific resistivity and hardness of the film increase as RF power is low, and the life of the active species increases as pressure is low, the processing temperature of the plastic substrate can be lowered and a film having improved homogeneity for a large area can be obtained. Further, since the plasma density reduces at low pressure, it is further effective for an increase of the specific resistivity of the carbon film by utilizing a magnetic field confining effect.

Further, as a hard carbon film of good quality can be formed on the substrate by the method even at a low temperature of normal temperature to 150° C., it is optimum for lowering the temperature in the production process for the MIM device with a substrate according to the present invention. Therefore, since a wide selection of materials for the substrate becomes possible and control of the temperature of the substrate becomes easy, the method has an advantageous feature capable of obtaining a carbon film of large area with homogeneous property.

Further, as can be seen from Table 1, the structure and the physical property of the carbon film can be controlled over a wide range and there is also an advantage that a degree of freedom for a design of the device features is big. Further, since the specific dielectric constant of the film is as low as 2 to 6 when compared with $Ta_2O_5$, $Al_2O_3$ and $SiN_x$ used so far as the insulating film material of the conventional MIM device, the size can be increased in preparing a device of the same electric capacitance and, accordingly, fine fabrication is no longer necessary and as a result the yield of the device is improved. However, judging from a relation with the driving condition, about 10:1 capacitance ratio between the liquid crystals and the MIM device is preferable. Further, as a device steepness, β, is in a following relation:

$$\beta \propto \frac{1}{\sqrt{\epsilon \cdot d}}$$

the steepness, β, increases when the dielectric constant, ε, of the carbon film is small and the ratio between an ON current, $I_{on}$, and an OFF current, $I_{off}$, can take a large value and accordingly, a liquid crystal display can be driven at a low duty ratio to realize a high density liquid crystal display. Further, since the hardness of the carbon film is high, the film is less injured by the rubbing treatment and improves the yield also.

In view of the above, use of the hard carbon insulating film in the MIM device makes it possible to realize a liquid crystal display device having high color gradation and high density at a low cost.

Further, different effects can also be given to the device by doping elements other than carbon and hydrogen in the hard carbon film.

For example, when elements belonging to the groups III and V of the periodical table, to alkali metals, and to alkaline earth metals, nitrogen or oxygen are doped in the film as constituent elements, the film thickness can be made twice to three times as compared with an undoped film, and can prevent the generation of pinholes upon fabrication of the device and further improve the mechanical strength of the device remarkably.

Further, because stability and hardness of the film doped with elements belonging to group IV of the periodical table, chalcogen series and halogen elements, nitrogen or oxygen are remarkably improved, a device of high reliability can be fabricated. An effect obtained by doping group IV elements, chalcogen element, nitrogen and oxygen is the effect caused by a reduction of active double bonds in the film, while the adding effects of the halogen elements are (1) promoting decomposition of the starting gas by hydrogen abstraction reaction and reducing dangling bonds in the film and (2) substituting hydrogen in the C—H bond with halogen element X in the film-forming process and increasing the bonding energy (bonding energy of C—X is greater than that of C—H).

To dope the above element into the film as a constituent element, a gas containing a compound or a molecule having the above elements other than carbon and hydrogen in addition to a compound containing carbon and hydrogen is to be used.

As the compound containing an element belonging to group III of the periodical table, $B(OC_2H_5)_3$, $B_2H_6$, $BCl_3$, $BBr_3$, $BF_3$, $Al(O-i-C_3H_7)_3$, $(CH_3)_3Al$, $(C_2H_5)_3Al$, $(i-C_4H_9)_3Al$, $AlCl_3$, $Ga(O-i-C_3H_7)_3$, $(CH_3)_3Ga$, $(C_2H_5)_3Ga$, $GaCl_3$, $GaBr_3$, $(O-i-C_3H_7)_3In$ and $(C_2H_5)_3In$ can be exemplified.

As the compound containing an element belonging to group IV of the periodical table, $(C_2H_5)_3SiH$, $SiF_4$, $SiH_2Cl_2$, $SiCl_4$, $Si(OCH_3)_4$, $Si(OC_2H_5)_4$, $Si(OC_3H_7)_4$, $GeCl_4$, $GeH_4$, $Ge(OC_2H_5)_4$, $Ge(C_2H_5)_4$, $(CH_3)_4Sn$, $(C_2H_5)_4Sn$ and $SnCl_4$ can be exemplified.

As the compound containing an element belonging to group V of the periodical table, $PH_3$, $PF_3$, $PF_5$, $PCl_2F_3$, $PCl_3$, $PCl_2F$, $PBr_3$, $PO(OCH_3)_3$, $P(C_2H_5)_3$, $POCl_3$, $AsH_3$, $AsCl_3$, $AsBr_3$, $AsF_5$, $AsCl_5$, $SbH_3$, $SbF_3$, $SbCl_3$ and $Sb(OC_2H_5)_3$ can be exemplified.

As the compound containing an alkali metal atom, $LiO—i—C_3H_7$, $NaO—i—C_3H_7$ and $KO—i—C_3H_7$ can be exemplified.

As the compound containing an alkaline earth metal atom, $Ca(OC_2H_5)_3$, $Mg(OC_2H_5)_2$ and $(C_2H_5)_2Mg$ can be exemplified.

As the compound containing a nitrogen atom, an inorganic compound such as nitrogen gas and ammonia, an organic compound having a functional group such as an amino group and a cyano group and a nitrogen-containing heterocyclic compound can be exemplified.

As the compound containing an oxygen atom, an inorganic compound such as oxygen gas, ozone, water (steam), hydrogen peroxide, carbon monoxide, carbon dioxide, carbon suboxide, nitrogen monoxide, nitrogen dioxide, dinitrogen trioxide, dinitrogen pentoxide and nitrogen trioxide, and organic compound having a functional group or bonding such as hydroxy group, aldehyde group, acyl group, ketone group, nitro group, nitroso group, sulfone group, ether bond, ester bond, peptide bonds and oxygen-containing heterocyclic group and, further, metal alkoxide can be exemplified.

As the compound containing the chalcogenic element, $H_2S$, $(CH_3)$ $(CH_2)_4S(CH_2)_4CH_3$, $CH_2=CHCH_2SCH_2CH=CH_2$, $C_2H_5SC_2H_5$, $C_2H_5SCH_3$, thiophene, $H_2Se$, $(C_2H_5)_2Se$ and $H_2Te$ can be exemplified.

Further, as the compound containing a halogen atom, an inorganic compound such as fluorine, chlorine, bromine, iodine, hydrogen fluoride, carbon fluoride, chlorine fluoride, bromine fluoride, iodine fluoride, hydrogen chloride, bromine chloride, iodine chloride, hydrogen bromide, iodine bromide and hydrogen iodide, an organic compound such as halogenated alkyl, halogenated aryl, halogenated styrene, halogenated polymethylene and haloform can be exemplified.

As the hard carbon film suitable for the liquid crystal driving MIM device a film having thickness from 100 to 8,000 Å and a specific resistivity from $10^6$ to $10^{13}$ ohm·cm is preferable in view of driving conditions.

Further, considering an increase of the difference between a driving voltage and a withstand voltage (insulation breakdown voltage), the film thickness is preferably not smaller than 200 Å. On the other hand, the film thickness is preferably not larger than 6,000 Å to control color unevenness attributable to a level difference between the picture element portion and the thin film two terminal device section (cell gap difference) not to cause any substantial problem. Accordingly, the thickness of the film is preferably from 200 to 6,000 Å and the specific resistivity is from $5\times10^6$ to $10^{13}$ ohm·cm.

Further, in view of a generation of pinholes and a uniform thickness of the film number of defects in the device caused by the pinholes becomes particularly remarkable when a film thickness is less than 300 Å and the ratio of defects per device exceeds 1%. Further, referring to a uniformity of the film thickness within a plane which affects the uniformity of the device properties, since a limit for an accuracy upon controlling the film thickness is 30 Å, deviation of the film thickness can not be reduced to less than 10% if the film thickness is less than 300 Å. Accordingly, it is preferable that the thickness of the carbon film is not smaller than 300 Å. Further, for preventing peeling of the film due to an internal stress of the film and for driving at a low duty ratio, if possible, less than 1/1,000, the film thickness is preferably not larger than 4,000 Å.

Considering the foregoing collectively, it is particularly preferable that the thickness of the hard carbon film is 300 to 4,000 Å and the specific resistivity is $10^7$ to $10^{11}$ ohm·cm.

EXAMPLES

The present invention will now be described more concretely referring to the following examples but the present invention is not limited by the examples.

EXAMPLE 1

Figure 2:
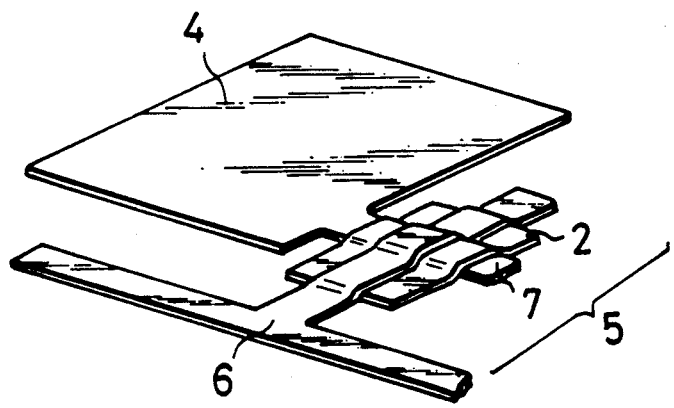
FIG. 2 is an explanatory view for a main portion of a metal-insulator-metal (hereinafter referred to as "MIM") device according to the present invention.
Figure 3:
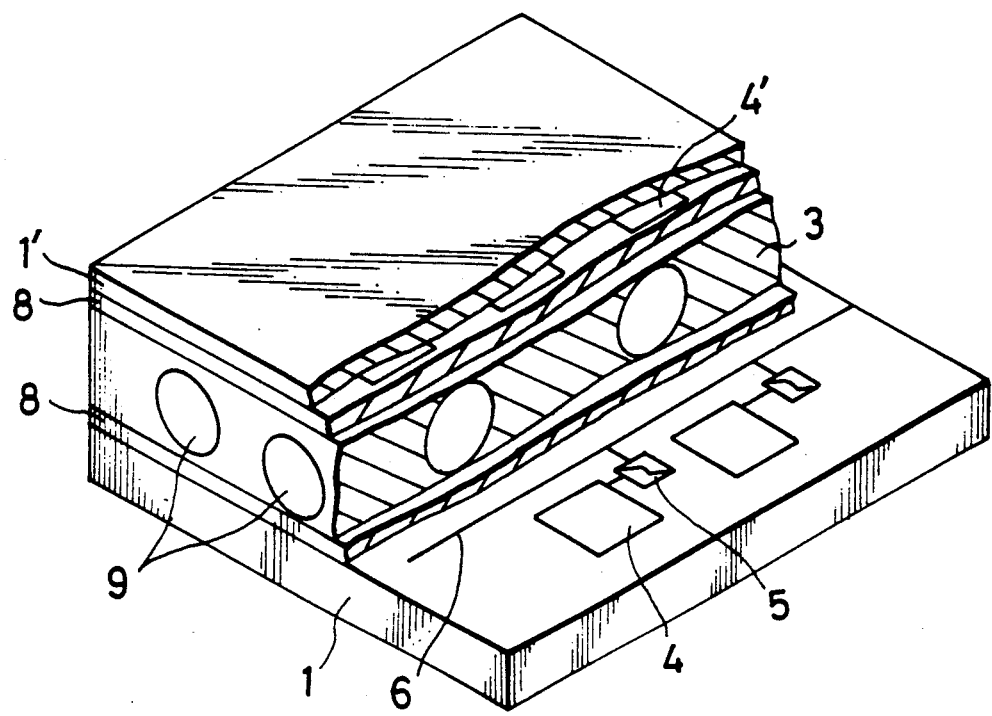
FIG. 3 is a perspective view partially in cross section of a liquid crystal display device in which the device according to the present invention is incorporated.
Figure 8:
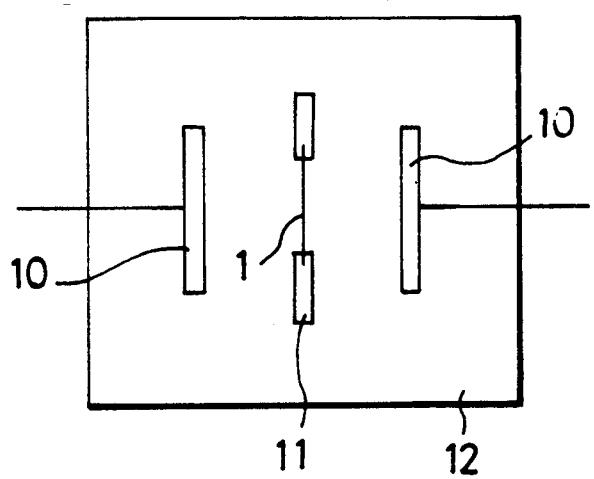
FIG. 8 is an explanatory view for a simultaneous both-faces sputtering apparatus used for a fabrication of the multi-layer device according to the present invention.

As shown in FIGS. 1 and 2, on a polyester film 1 having a thickness of 100 μm, $SiO_2$ films 2a and 2b, respective thickness of about 2,000 Å, were formed simultaneously on both surfaces of the film 1 by using a both side simultaneous sputtering apparatus shown in FIG. 8, and a ITO was formed into a film of a thickness about 1,000 Å by a sputtering method on the $SiO_2$ film 2b and then patterned to form a picture element electrode 4. Then, aluminum was formed into a film of about 1,000 Å thickness on the electrode 4 by means of a vapor deposition and patterned to form a lower electrode 7. Over the electrode 7, a hard carbon film was formed in a thickness of about 1,000 Å by a plasma CVD process to form an insulating layer 2 which was patterned by a dry etching process. The film-forming conditions for the carbon film were as follows:

Pressure: 0.035 Torr
$CH_4$ flow rate: 10 SCCM
RF power: 0.2 W/cm$^2$
SCCM = Standard cm$^3$ per minutes.

Further, on the carbon film, a nickel film was formed in about 1,000 Å thickness by an electron beam vapor deposition process and then patterned to form an upper electrode (lead electrode) 6 and obtained a MIM device with a substrate.

EXAMPLE 2

A MIM device with a substrate was fabricated in the same procedures as those in Example 1 except for using a polycarbonate substrate of 1 mm thickness instead of the polyester film of 100 μm thickness and forming an Si₃N₄ layer of 1,500 Å thickness instead of the SiO₂ film of about 2,000 Å thickness.

EXAMPLE 3

A MIM device with a substrate was fabricated in the same procedures as those in Example 2 except for using a polyether sulfone film of 250 μm thickness instead of the polycarbonate substrate of 1 mm thickness.

EXAMPLE 4

A MIM device with a substrate was fabricated in the same procedures as those in Example 1 except for using a polyaryrate film of 100 μm thickness instead of the polyester film of 100 μm thickness and forming a SiO₂ film 2a of about 7,000 Å thickness on one surface and a SiO₂ film 2b of about 6,000 Å thickness on the other surface of the plastic substrate 1 instead of SiO₂ films of about 2,000 Å thickness formed simultaneously on both surfaces of the plastic substrate 1.

Neither deformation and curling of the substrate nor crack in the inorganic substance film were observed in the MIM devices fabricated in Examples 1 to 4. Further, degradation was observed in none of the devices after 200 hours continuous operation.

EXAMPLE 5

As shown in FIGS. 1 and 2, on both surfaces of a polyarylate substrate 1 of 100 μm thickness, SiO₂ was sputtered while introducing CF₄ at a substrate temperature of 50° C. using a both side simultaneous sputtering apparatus shown in FIG. 8 and formed SiO₂:F layers 2a and 2b of about 6,000 Å thickness simultaneously. By X-ray diffractiometry, it was confirmed that film of the layers were amorphous. Further, transmittance of the films for a light of a wavelength within 400 to 850 nm was 80% or more. Then, the SiO₂:F film 2b was treated with a plasma of an oxygen gas, an ITO film of about 1,000 Å thickness was formed by a sputtering process on the film 2b and then the ITO film was patterned to form a picture element electrode 4.

By the same subsequent procedures as those in Example 1, a MIM device with a substrate was fabricated.

EXAMPLE 6

Si₃N₄:F layers 2a and 2b of about 5,000 Å thickness were prepared in the same procedures as those in Example 5 except for using a polyether sulfone substrate of 100 μm thickness instead of the polyarylate substrate of 100 μm thickness, introducing HF instead of CF₄, setting the substrate temperature at 30° C. instead of 50° C. and using Si₃N₄ instead of SiO₂. It was confirmed that film of the layers 2a and 2b was amorphous and the transmittance of the film for a light of a wavelength within 400 to 850 nm was 80% or more. With the same subsequent procedures as those in Example 5, a MIM device with a substrate was fabricated.

Peeling of the film, deformation and curl of the substrate, as well as cracks in the inorganic substance thin film layers were not observed in the MIM devices fabricated in Examples 5 and 6.

What is claimed is:

1. A deposited multi-layer device comprising an electronic element and a plastic substrate including first and second surfaces provided with a first inorganic thin film and a second inorganic thin film formed simultaneously on respective first and second surfaces of said substrate, wherein the electronic element, the plastic substrate and the inorganic thin films each have internal and thermal stress not equal to zero, wherein the total value of internal and thermal stress in said first inorganic thin film on which said electronic element is fabricated plus the stress in the electronic element is equal to the value of the internal and thermal stress in said second inorganic thin film on said substrate, thereby preventing deformation of said multi-layer device.

2. The device according to claim 1, wherein at least one of said first and second inorganic thin films consists essentially of a fluorine containing silicon compound.

3. The device according to claim 2, wherein said at least one of said first and second inorganic thin films consists essentially of a silicon compound not substantially containing fluorine.

4. A deposited multi-layer device comprising an electronic element and a plastic substrate, both having internal and thermal stress not equal to zero, wherein an inorganic thin film cancels the total internal and thermal stress of said electronic element and plastic substrate is formed at least on one surface of said plastic substrate, thereby preventing deformation of said multi-layer device.

5. The device according to claim 4, wherein said inorganic thin film consists essentially of a fluorine containing silicon compound.

6. The device according to claim 4, wherein said inorganic thin film consists essentially of a silicon compound not substantially containing fluorine.

7. The device according to claim 1 or 4, wherein said device is a MIM device.

8. The device according to claim 1 or 4, wherein said device has a hard carbon film as an additional insulating film.

9. A method for making a deposited multi-layer device comprising an electronic element and a plastic substrate provided with an inorganic thin film on both a first and second surface of the substrate comprising:
simultaneously forming said inorganic thin film on both a first and second surface of said substrate, wherein each of the electronic element, plastic substrate and inorganic thin film have internal and thermal stress not equal to zero, wherein the total value of internal and thermal stress in said first inorganic thin film on which said electronic element is fabricated plus the stress in the electronic element is equal to the value of the internal and thermal stress in said second inorganic thin film on said substrate,
thereby preventing deformation of said multi-layer device.

10. The method according to claim 9, wherein said inorganic thin film consists essentially of a fluorine containing silicon compound.

11. The method according to claim 9, wherein said inorganic thin film consists essentially of a silicon compound not substantially containing fluorine.

* * * * *

UNITED STATES PATENT AND TRADEMARK OFFICE
CERTIFICATE OF CORRECTION

PATENT NO. : 5,319,479
DATED : June 7, 1994
INVENTOR(S) : Katsuyuki YAMADA, et al.

It is certified that error appears in the above-indentified patent and that said Letters Patent is hereby corrected as shown below:

On the title page, Item [54] and Column 1, Lines 2-4, the title should read as follows:

--DEPOSITED MULTI-LAYER DEVICE WITH A PLASTIC SUBSTRATE HAVING AN INORGANIC THIN FILM LAYER FOR CANCELLING STRESS--

Signed and Sealed this

Sixth Day of September, 1994

Attest:

BRUCE LEHMAN

*Attesting Officer*  *Commissioner of Patents and Trademarks*